(12) United States Patent
Iwashita et al.

(10) Patent No.: US 8,997,822 B2
(45) Date of Patent: Apr. 7, 2015

(54) SUBSTRATE INVERTING DEVICE, SUBSTRATE INVERTING METHOD, AND PEELING SYSTEM

(75) Inventors: Yasuharu Iwashita, Koshi (JP); Osamu Hirakawa, Koshi (JP); Masaru Honda, Koshi (JP); Akira Fukutomi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/979,549

(22) PCT Filed: Jan. 12, 2012

(86) PCT No.: PCT/JP2012/050465
§ 371 (c)(1),
(2), (4) Date: Jul. 12, 2013

(87) PCT Pub. No.: WO2012/098986
PCT Pub. Date: Jul. 26, 2012

(65) Prior Publication Data
US 2013/0292062 A1 Nov. 7, 2013

(30) Foreign Application Priority Data
Jan. 19, 2011 (JP) .................................. 2011-009309

(51) Int. Cl.
| | | |
|---|---|---|
| B32B 38/10 | (2006.01) |
| H01L 21/67 | (2006.01) |
| H01L 21/677 | (2006.01) |
| H01L 21/683 | (2006.01) |
| H01L 21/687 | (2006.01) |

(52) U.S. Cl.
CPC .... *H01L 21/67011* (2013.01); *H01L 21/67092* (2013.01); *H01L 21/6715* (2013.01); *H01L 21/67748* (2013.01); *H01L 21/6838* (2013.01); *H01L 21/68707* (2013.01)

(58) Field of Classification Search
USPC ............................... 438/14, 15, 455, 458, 459
See application file for complete search history.

(56) References Cited

U.S. PATENT DOCUMENTS

| | | | | |
|---|---|---|---|---|
| 6,527,031 | B1 * | 3/2003 | Yanagita et al. | 156/757 |
| 7,192,242 | B2 * | 3/2007 | Baba | 414/749.3 |
| 2006/0231202 | A1 * | 10/2006 | Sakata et al. | 156/344 |
| 2009/0087932 | A1 * | 4/2009 | Kondoh | 438/30 |
| 2011/0123913 | A1 * | 5/2011 | Yoshimoto | 430/30 |

FOREIGN PATENT DOCUMENTS

JP 9-167724 A 6/1997

OTHER PUBLICATIONS

International Search Report cited in PCT Application No. PCT/JP2012/050465, dated Mar. 12, 2012.

* cited by examiner

*Primary Examiner* — Mark A Osele
*Assistant Examiner* — Nickolas Harm
(74) *Attorney, Agent, or Firm* — Nath, Goldberg & Meyer; Jerald L. Meyer; Tiffany A. Johnson

(57) ABSTRACT

According to an embodiment of the present disclosure, a substrate inverting device for inverting front and rear surfaces of a substrate is provided. The substrate includes a first holding unit configured to hold one surface of the substrate and a second holding unit disposed to face the first holding unit and configured to hold one surface of the substrate. Further, the substrate includes a moving mechanism configured to relatively move at least one of the first holding unit and the second holding unit to approach each other and stay spaced apart from each other, and a transfer mechanism configured to hold the one surface of the substrate. In this case, a support of the substrate in the first holding unit, the second holding unit and the transfer mechanism is performed by a Bernoulli chuck.

3 Claims, 14 Drawing Sheets

SUBSTRATE INVERTING DEVICE, SUBSTRATE INVERTING METHOD, AND PEELING SYSTEM

TECHNICAL FIELD

The present disclosure relates to a substrate inverting device for inverting a substrate, a substrate inverting method using the substrate inverting device, and a peeling system including the substrate inverting device.

BACKGROUND

In recent years, the diameter of semiconductor wafers (hereinafter, referred to as "wafers") are increasing. In addition, there is a desire to make the wafers thin in a specified process such as mounting or the like. However, a large-diameter thin wafer is likely to be bent or cracked if the wafer is transferred or polished as is. Therefore, in order to support the wafer, the wafer is bonded to, for example, another wafer or a glass substrate that acts as a support substrate. Thereafter, a predetermined process such as a polishing process is performed on the wafer in a state where the wafer is bonded to the support substrate as described above, and subsequently, the wafer and the support substrate are peeled off from each other.

Such a peeling is performed, for example, using a peeling device. For example, the peeling device includes a first holder for holding the wafer, a second holder for holding the support substrate, and a nozzle for injecting liquid between the wafer and the support substrate. In the peeling device, the nozzle injects liquid between the wafer and the support substrate which are bonded together at an injection pressure. The injection pressure is greater than a bonding strength applied in bonding the wafer and the support substrate, preferably, at an injection pressure that is two or more times stronger than the bonding strength, thus peeling the wafer and the support substrate (see Patent Document 1).

PRIOR ART DOCUMENT

Patent Document

Patent Document 1: Japanese Laid-open Patent Publication H9-167724

After the wafer and the support substrate are peeled off from each other as described above, each of the bonding surfaces of the wafer and the support substrate is cleaned. However, in addition to the bonding surface of the wafer, a non-bonding surface opposite to the bonding surface of the wafer needs to be cleaned to minimize an inflow of particles in a subsequent process.

In cleaning the non-bonding surface of the wafer, for example, the bonding surface of the wafer is first cleaned with the non-bonding surface, which is being held, and subsequently, the non-bonding surface is cleaned with the bonding surface being held. As such, the cleaning of the non-bonding surface requires inverting the front and rear surfaces of the wafer.

In the conventional art, for example, a wafer inverting arm 500 as shown in FIG. 20 has been used as an inverting device. As shown in FIG. 20, the wafer inverting arm 500 includes a pair of chuck parts 501 and 501 which are capable of approaching each other and spaced apart from each other. The chuck parts 501 and 501 include respective wafer holding units 502 and 502. When the pair of chuck parts 501 and 501, which are placed away from each other, approach each other, a peripheral portion of a wafer W is inserted between the wafer holding units 502 and 502 so that the wafer W is held by them. A rotation mechanism 503 configured to support the wafer inverting arm 500 rotates the wafer inverting arm 500 around its horizontal axis, thus inverting the wafer W.

Unfortunately, since a wafer which has been polished has a thin thickness, the use of the wafer inverting arm 500 as shown in FIG. 20 as the inverting device may cause bending or a crack in the wafer, as described above.

SUMMARY

The present disclosure has been made in consideration of the above points, and some embodiments provide to invert front and rear surfaces of a wafer which is thinned by a polishing process without causing a bending or a crack.

According to an embodiment of the present disclosure, a substrate inverting device for inverting front and rear surfaces of a substrate is provided. The substrate includes a first holding unit configured to hold one surface of the substrate and a second holding unit disposed to face the first holding unit and configured to hold one surface of the substrate. Further, the substrate includes a moving mechanism configured to relatively move at least one of the first holding unit and the second holding unit to approach each other and stay spaced apart from each other, and a transfer mechanism configured to hold the one surface of the substrate. In this case, a support of the substrate in the first holding unit, the second holding unit and the transfer mechanism is performed by a Bernoulli chuck.

According to the substrate inverting device of the present disclosure, provided are the first holding unit and the second holding unit which are disposed to face each other, and the moving mechanism which relatively moves the first holding unit and the second holding unit such that they approach each other and stay spaced apart from each other. With this configuration, for example, the substrate is transferred to the first holding unit by the transfer mechanism so that one surface of the substrate is held by the first holding unit, and subsequently, the first holding unit and the second holding unit approach each other so that the substrate is transferred to the second holding unit, which is allowed an opposite surface of a surface of the substrate held by the first holding unit to be held by the second holding unit. In other words, a surface of the substrate held by one holding unit can be alternately held by another holding unit. Further, the transfer mechanism further holds the opposite surface of the substrate which is held by the second holding unit so that the front and rear surfaces of the substrate which is held by the transfer mechanism are inverted upside down. Further, in this embodiment, the substrate is held by the Bernoulli chuck in the course of inverting the substrate, it is possible to invert the front and rear surfaces of the substrate which is thinned by a polishing process without causing a bending or a crack.

According to an embodiment of the present disclosure, a peeling system for peeling off a substrate to be processed and a support substrate from an overlapped substrate, the overlapped substrate being formed by bonding the substrate to be processed and the support substrate by an adhesive is provided. The peeling system includes a peeling process station including a peeling device configured to peel off the substrate to be processed and the support substrate from the overlapped substrate, a first cleaning device configured to clean the substrate to be processed peeled by the peeling device, and a second cleaning device configured to clean the support substrate peeled by the peeling device. The peeling system further includes a carry-in/carry-out station configured to carry at least one of the substrate to be processed, the support substrate and the overlapped substrate in and out of the peeling process station, and a transfer station configured to transfer the substrate to be processed, at least one of the support substrate and the overlapped substrate between the peeling process station and the carry-in/carry-out station, and an interface station configured to transfer the substrate to be processed between the peeling process station and a post-treatment station configured to perform a predetermined post-treatment on the substrate to be processed peeled in the peeling process station. The peeling system also includes an inspection device disposed adjacent to the interface station and configured to inspect the substrate to be processed, and an inspection-after cleaning station disposed adjacent to the interface station and configured to clean the substrate to be processed inspected by the inspection device. In this peeling system, the inspection-after cleaning station includes a bonding surface cleaning device configured to clean a bonding surface of the substrate to be processed, a non-bonding surface cleaning device configured to clean a non-bonding surface of the substrate to be processed, and a substrate inverting device configured to invert the front and rear surfaces of the substrate to be processed. Also, in the peeling system, the substrate inverting device includes a first holding unit configured to hold one surface of the substrate, a second holding unit disposed to face the first holding unit and configured to hold one surface of the substrate, a moving mechanism configured to relatively move at least one of the first holding unit and the second holding unit to approach each other and stay spaced apart from each other, and a transfer mechanism configured to hold the one surface of the substrate. In addition, a support of the substrate in the first holding unit, the second holding unit and the transfer mechanism is performed by a Bernoulli chuck.

According to an embodiment of the present disclosure, a method of inverting front and rear surfaces of a substrate using a substrate inverting device is provided. In the method, a substrate inverting device includes a first holding unit configured to hold one surface of the substrate, a second holding unit disposed to face the first holding unit and configured to hold one surface of the substrate, a moving mechanism configured to relatively move at least one of the first holding unit and the second holding unit to approach each other and stay spaced apart from each other, and a transfer mechanism configured to hold the one surface of the substrate. Further, a support of the substrate in the first holding unit, the second holding unit and the transfer mechanism is performed by a Bernoulli chuck. The method includes transferring, by the transfer mechanism, the substrate to the first holding unit where one surface of the substrate is held, approaching, by the moving mechanism, the first holding unit and the second holding unit each other such that the substrate is transferred to the second holding unit, and holding, by the transfer mechanism, the substrate held by the second holding unit.

EFFECTS OF THE PRESENT DISCLOSURE

According to the present disclosure, it is possible to invert front and rear surfaces of a wafer which is thinned by a polishing process without causing a bending or a crack.

DETAILED DESCRIPTION

Figure 1:
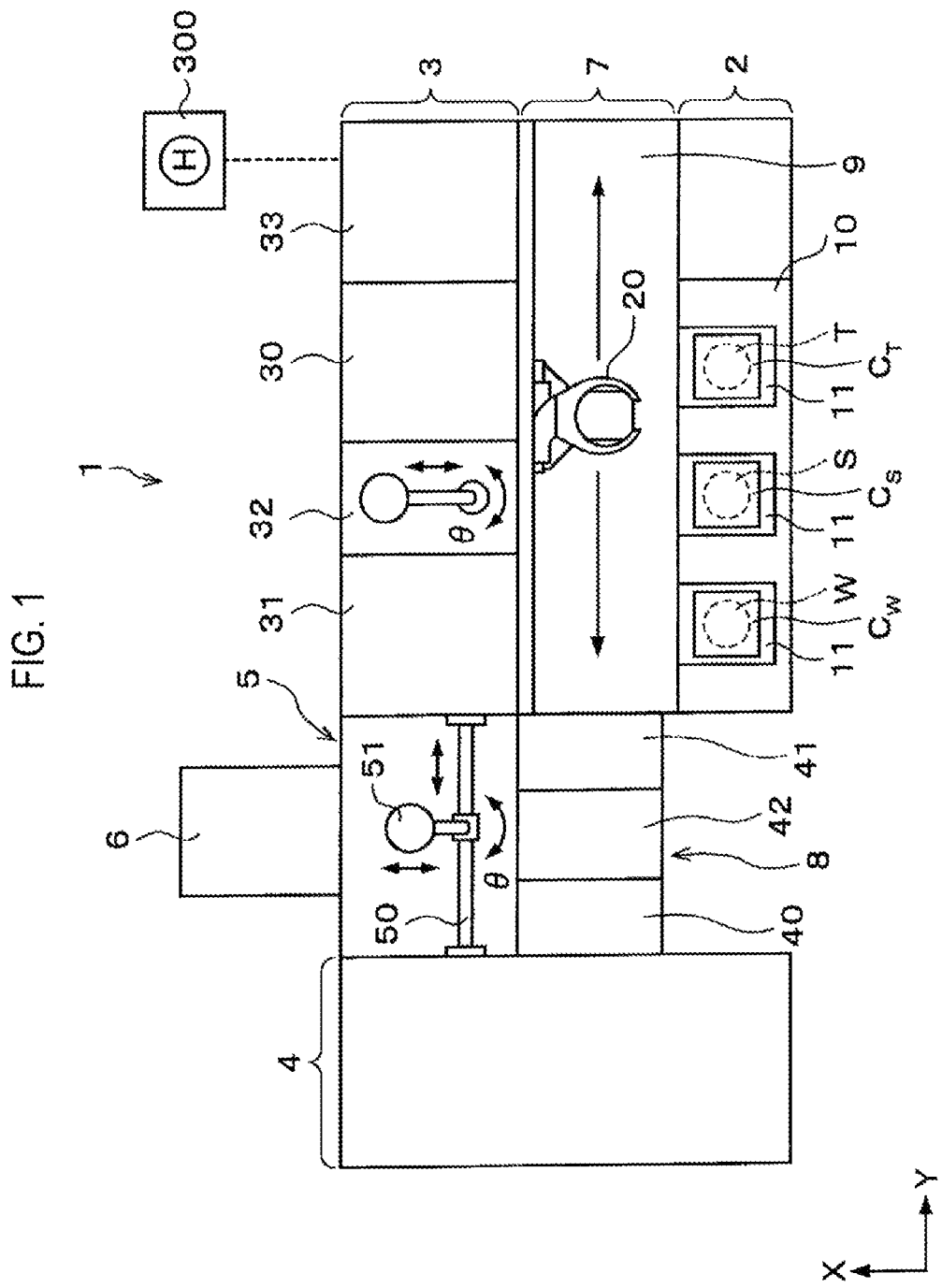
FIG. 1 is a plane view schematically showing a configuration of a peeling system according to an embodiment of the present disclosure.

Hereinafter, embodiments of the present disclosure will be described. FIG. 1 is a plane view schematically showing a configuration of a peeling system 1 including a substrate inverting device according to an embodiment.

Figure 2:
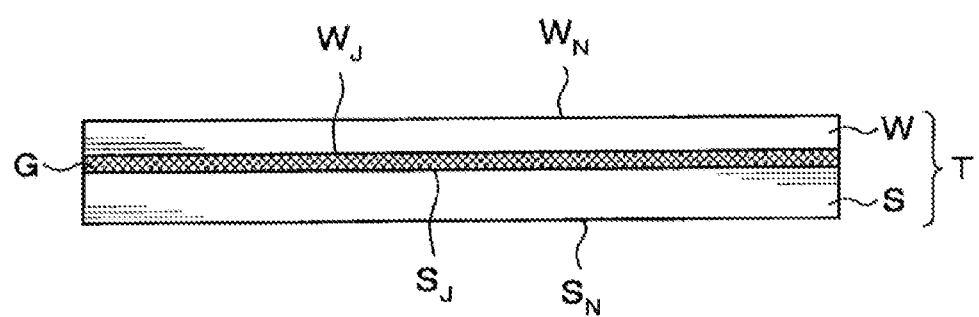
FIG. 2 is a lateral view of a wafer to be processed and a support wafer.

In the peeling system 1, an overlapped wafer T as an overlapped substrate is formed by bonding a wafer to be processed W as a substrate to be processed and a support wafer S as a support substrate by an adhesive G as shown in FIG. 2. Further, the overlapped wafer T is separated into the wafer to be processed W and the support wafer S. Hereinafter, in the wafer to be processed W, a surface to be bonded to the support wafer S through the adhesive G will be referred to as a "bonding surface $W_J$," and an opposite surface of the bonding surface $W_J$ will be referred to as a "non-bonding surface $W_N$." Similarly, in the support wafer S, a surface to be bonded to the wafer to be processed W through the adhesive G will be referred to as a "bonding surface $S_J$," and a "non-bonding surface $S_N$." In addition, the wafer to be processed W is a wafer to be used as a product. A plurality of electronic circuits is formed on, e.g., the bonding surface $W_J$ of the wafer to be processed W. Further, for example, the non-bonding surface $W_N$ of the wafer to be processed W is subjected to a polishing so that a thickness thereof becomes thin (by, e.g., 50 μm). The support wafer S has the same diameter as that of the wafer to be processed W and supports the wafer to be processed W. While in this embodiment, the wafer has been described to be used as the support substrate, the present disclosure is not limited thereto. For example, another substrate such as a glass substrate may be used as the support substrate.

As shown in FIG. 1, the peeling system 1 includes a carry-in/carry-out station 2, a peeling process station 3, the support wafers S and the overlapped wafers T, an interface station 5 and a post-treatment station 4 disposed adjacent thereto, and an inspection device 6. In the carry-in/carry-out station 2, cassettes $C_W$, $C_S$ and $C_T$ are carried in and out between the carry-in/carry-out station 2 and the outside, and the peeling process station 3 includes various processing units which are configured to perform a predetermined process on the wafers to be processed W. The interface station 5 is configured to deliver the wafers to be processed W between the peeling process station 3, and the inspection device 6 is configured to inspect the wafers to be processed W before they are delivered to the post-treatment station 4. These stations 2, 3, 4, 5 and 6 are connected serially. The cassettes $C_W$, $C_S$ and $C_T$ are configured to accommodate a plurality of wafers to be processed W, a plurality of support wafers S, and a plurality of overlapped wafers T therein, respectively.

The carry-in/carry-out station 2 and the peeling process station 3 are arranged in a line along an X-axis direction (vertical direction in FIG. 1). A transfer station 7 is provided between the carry-in/carry-out station 2 and the peeling process station 3. The interface station 5 is disposed at the backside of the peeling process station 3 along a Y-axis direction (at the left side in FIG. 1). In addition, the inspection device 6 is disposed at the forward side of the interface station 5 along the X-axis direction (the upside in FIG. 1). A inspection-after cleaning station 8 is configured to clean the bonding surface $W_J$ and the non-bonding surface $W_N$ of the wafer to be processed W after the inspection, and invert front and rear surfaces of the wafer to be processed W. The inspection-after cleaning station 8 is disposed opposite to the inspection device 6 with the interface station 5 interposed therebetween, i.e., at the backside of the interface station 5 along the X-axis direction.

A cassette loading table 10 is disposed in the carry-in/carry-out station 2. A plurality of, e.g., three, cassette loading plates 11 are disposed in the cassette loading table 10. The cassette loading plates 11 are arranged in a line along the Y-axis direction (the left and right direction in FIG. 1). The cassette loading plates 11 can load thereon the cassettes $C_W$, $C_S$ and $C_T$ when they are carried in and out between the carry-in/carry-out station 2 and the outside of the peeling system 1, respectively. In this way, the carry-in/carry-out station 2 can hold the plurality of wafers to be processed W, the plurality of support wafers S, and the plurality of overlapped wafers T. In addition, the number of the cassette loading plates 11 is not limited to this embodiment but may be selected as appropriate. Further, the plurality of overlapped wafers T loaded in the carry-in/carry-out station 2 are inspected in advance so that they are distinguished as a normal overlapped wafer including a normal wafer to be processed W and an abnormal overlapped wafer including an abnormal wafer to be processed W.

A first transfer device 20 is disposed in a wafer transfer region 9 which is defined inside the transfer station 7. The first transfer device 20 is equipped with a transfer arm, which is movable in vertical and horizontal directions (the Y and X-axis directions), and is rotatable around the vertical axis.

The first transfer device 20 moves inside the wafer transfer region 9 to transfer the wafer to be processed W, the support wafer S, and the overlapped wafer T between the carry-in/carry-out station 2 and the peeling process station 3.

The peeling process station 3 includes a peeling device 30 configured to peel off the wafer to be processed W and the support wafer S from the overlapped wafer T. A first cleaning device 31 configured to clean the wafer to be processed W which has been peeled off, is disposed at the backside of the peeling device 30 along the Y-axis direction (at the left side in FIG. 1). A second transfer device 32 is provided between the peeling device 30 and the first cleaning device 31. Further, a second cleaning device 33 configured to clean the support wafer S which has been peeled off, is disposed at the forward side of the peeling device 30 along the Y-axis direction (at the right side in FIG. 1). As described above, the first cleaning device 31, the second transfer device 32, the peeling device 30, and the second cleaning device 33 are arranged in the peeling process station 3 in order away from the interface station 5.

The inspection device 6 inspects whether a residual of the adhesive G exists on the wafer to be processed W which is peeled by the peeling device 30. The inspection-after cleaning station 8 cleans the wafer to be processed W which has been determined to have the residual of the adhesive G thereon by the inspection device 6. The inspection-after cleaning station 8 has a bonding surface cleaning device 40 for cleaning the bonding surface $W_J$ of the wafer to be processed W, a non-bonding surface cleaning device 41 for cleaning the non-bonding surface $W_N$ of the wafer to be processed W, and a wafer inverting device 42 as a substrate inverting unit for inverting front and rear surfaces of the wafer to be processed W upside down.

The interface station 5 is provided with a transfer mechanism 51, which is configured to move along a transfer path 50 extending along the Y-axis direction. The transfer mechanism 51, which is movable in a vertical direction and is also rotatable around the vertical axis (or in a θ direction) along a horizontal axis, transfers the wafer to be processed W between the peeling process station 3, the post-treatment station 4, the inspection device 6, and the inspection-after cleaning station 8. The transfer mechanism 51 constitutes a portion of the wafer inverting device 42.

Further, the post-treatment station 4 performs a predetermined post-treatment on the wafer to be processed W which is peeled by the peeling process station 3. An example of the predetermined post-treatment may include mounting the wafer to be processed W, inspecting electric properties of the electronic circuits formed on the wafer to be processed W, dicing the wafer to be processed W on a chip-by-chip basis, or the like.

Figure 3:
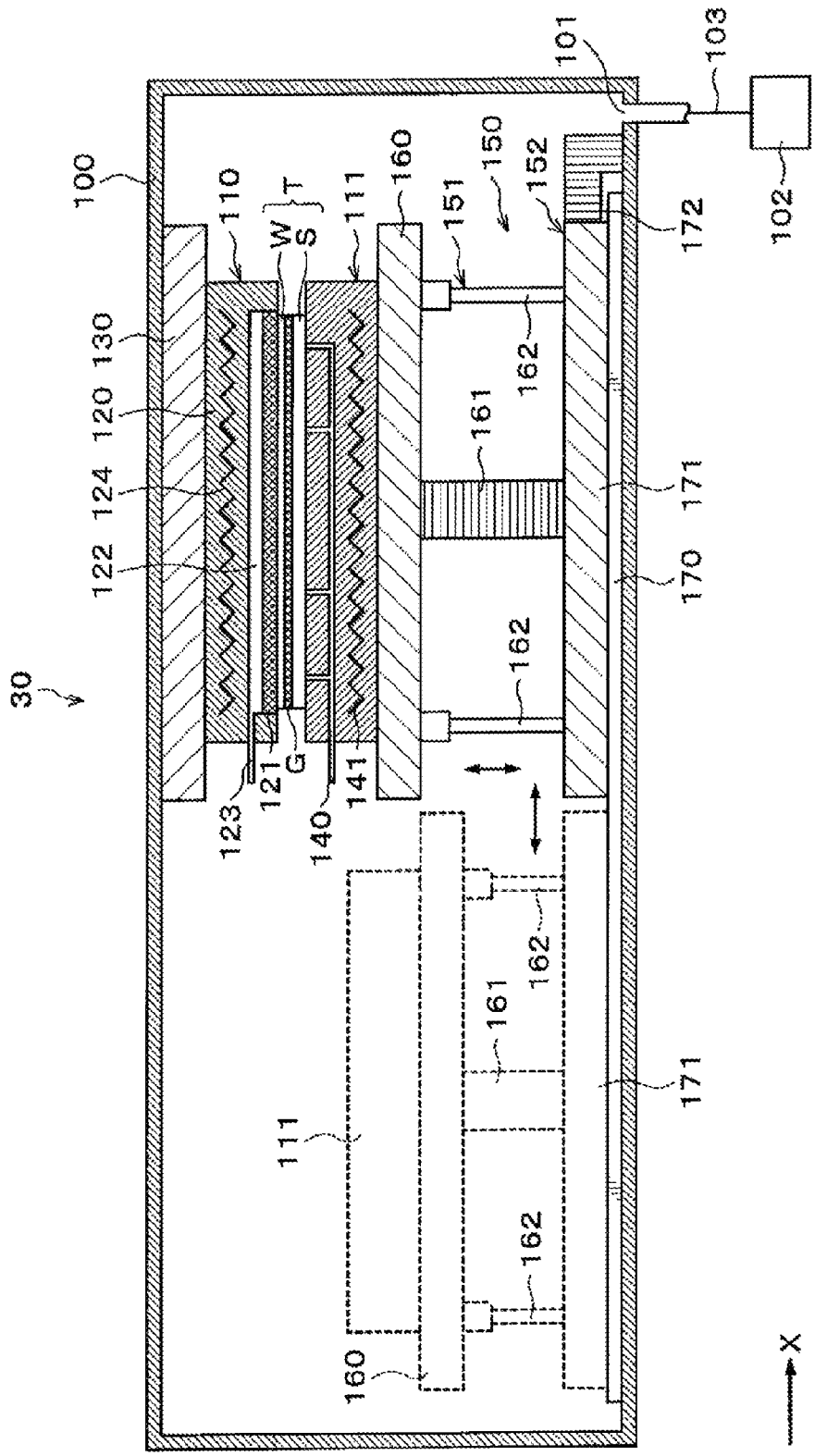
FIG. 3 is a longitudinal cross sectional view schematically showing a configuration of a peeling device.

Next, a configuration of the aforementioned peeling device 30 will be described. As shown in FIG. 3, the peeling device 30 includes a housing 100 in which a plurality of equipment is accommodated. An inlet/outlet (not shown), through which the wafer to be processed W, the support wafer S, and the overlapped wafer T are transferred, is formed in a lateral side of the housing 100. An opening/closing shutter (not shown) is installed at the inlet/outlet.

An exhaust port 101 is formed at a bottom of the housing 100 so that the internal atmosphere of the housing 100 is exhausted through the exhaust port 101. An exhaust pipe 103, which is in communication with an exhaust device 102, such as a vacuum pump, is connected to the exhaust port 101.

The housing 100 is provided with an upper chuck 110 configured to adsorb the wafer to be processed W on the bottom surface thereof, and a lower chuck 111 configured to hold the support wafer S on the upper surface thereof. The upper chuck 110 is disposed above the lower chuck 111 while being positioned to face the lower chuck 111. That is, the peeling process is performed on the overlapped wafer T within the housing 100 with the wafer to be processed W disposed on the upper side and the support wafer S disposed on the lower side.

An example of the upper chuck 110 may include a porous chuck. The upper chuck 110 includes a flat plate main body 120. A porous body 121 is formed at a bottom side of the main body 120. The porous body 121 has approximately the same diameter as that of the wafer to be processed W and is in contact with the non-bonding surface $W_N$ of the wafer to be processed W. An example of the porous body 121 may include a silicon carbide.

Further, a suction space 122 is formed inside the main body 120 and above the porous body 121. The suction space 122 is formed to cover, e.g., the porous body 121. The suction space 122 is connected to a suction pipe 123. The suction pipe 123 is connected to a negative pressure generator (not shown), e.g., a vacuum pump. The non-bonding surface $W_N$ of the wafer to be processed is sucked by the suction pipe 123 through the suction space 122 and the porous body 121 so that the wafer to be processed W is adsorbed by the upper chuck 110.

In addition, a heating mechanism 124 configured to heat the wafer to be processed W is installed inside the main body 120 and above the suction space 122. A heater, for example, may be used as the heating mechanism 124.

A support plate 130 configured to support the upper chuck 110 is installed on the upper surface of the upper chuck 110. The support plate 130 is supported on a ceiling surface of the housing 100. Alternatively, the support plate 130 of this embodiment may be omitted, and the upper chuck 110 may be supported by being in contact with the ceiling surface of the housing 100.

A suction pipe 140 configured to adsorb the support wafer S is installed inside the lower chuck 111. The suction pipe 140 is connected to an exhaust generator (not shown), e.g., a vacuum pump.

Further, a heating mechanism 141 configured to heat the support wafer S is installed inside the lower chuck 111. A heater, for example, may be used as the heating mechanism 141.

A moving mechanism 150 configured to vertically and horizontally move the lower chuck 111 and the support wafer S is provided below the lower chuck 111. The moving mechanism 150 includes a vertical moving unit 151 configured to vertically move the lower chuck 111, and a horizontal moving unit 152 configured to horizontally move the lower chuck 111.

The vertical moving unit 151 includes a support plate 160 for supporting the bottom surface of the lower chuck 111, a drive unit 161 which is configured to elevate up and down the support plate 160 such that the upper chuck 110 and the lower chuck 111 approach each other and are spaced apart from each other, and support members 162 for supporting the support plate 160. The drive unit 161 is equipped with, e.g., a ball screw (not shown) and a motor (not shown) to rotate the ball screw. The support members 162 are vertically expansible/contractible and are disposed at, e.g., three places between the support plate 160 and a supporting body 171, which will be described later.

The horizontal moving unit 152 includes a rail 170 extending in the X-axis direction (the left and right direction in FIG. 3), a supporting body 171 mounted to the rail 170, and a drive unit 172 for moving the supporting body 171 along the rail 170. The drive unit 172 is equipped with, e.g., a ball screw (not shown) and a motor (not shown) to rotate the ball screw.

In addition, elevating pins (not shown) which elevate the overlapped wafer T or the support wafer S supported from the bottom are disposed below the lower chuck 111. The elevating pins are inserted through through-holes (not shown) formed in the lower chuck 111 in such a manner that they project from the upper surface of the lower chuck 111.

Figure 4:
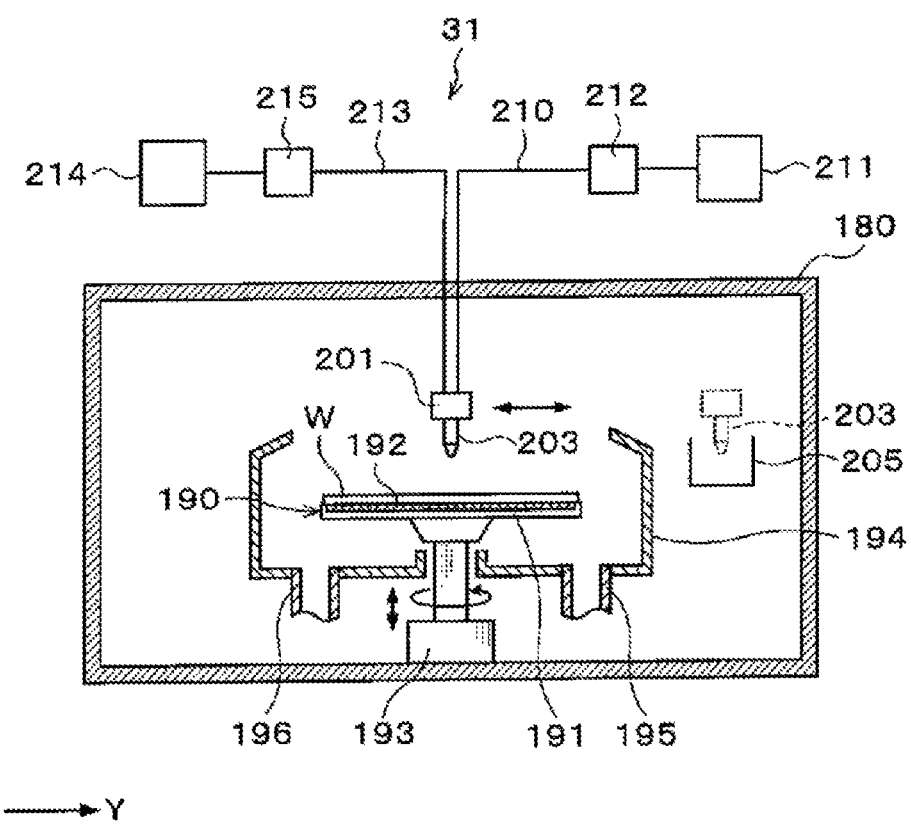
FIG. 4 is a longitudinal cross sectional view schematically showing a configuration of a first cleaning device.

Next, a configuration of the aforementioned first cleaning device 31 will be described. As shown in FIG. 4, the first cleaning device 31 includes a housing 180. An inlet/outlet (not shown), through which the wafer to be processed W is transferred, is formed in a lateral side of the housing 180, and an opening/closing shutter (not shown) is installed in the inlet/outlet.

A porous chuck 190 configured to hold and rotate the wafer to be processed W is installed in the central portion of the housing 180. The porous chuck 190 includes a flat plate main body 191, and a porous body 192 formed on an upper surface of the main body 191. The porous body 192 has approximately the same diameter as that of the wafer to be processed W and is in contact with the non-bonding surface $W_N$ of the wafer to be processed W. For example, a silicon carbide may be used as the porous body 192. A suction pipe (not shown) is connected to the porous body 192. The non-bonding surface $W_N$ of the wafer to be processed W is sucked by the suction pipe through the porous body 192 so that the wafer to be processed W is adsorbed on the porous chuck 190.

A chuck drive unit 193, which is equipped with, e.g., a motor, is provided below the porous chuck 190. The porous chuck 190 can be rotated at a predetermined speed by the chuck drive unit 193. Further, the chuck drive unit 193 includes an up-down drive source such as a cylinder, and can move the porous chuck 190 up and down.

A cup 194 is provided around the porous chuck 190 to receive and collect liquid dropped or scattered from the wafer to be processed W. A discharge pipe 195 for draining the collected liquid and an exhaust pipe 196 for applying vacuum into the cup 194 and discharging an atmosphere therewithin are connected to the bottom surface of the cup 194.

Figure 5:
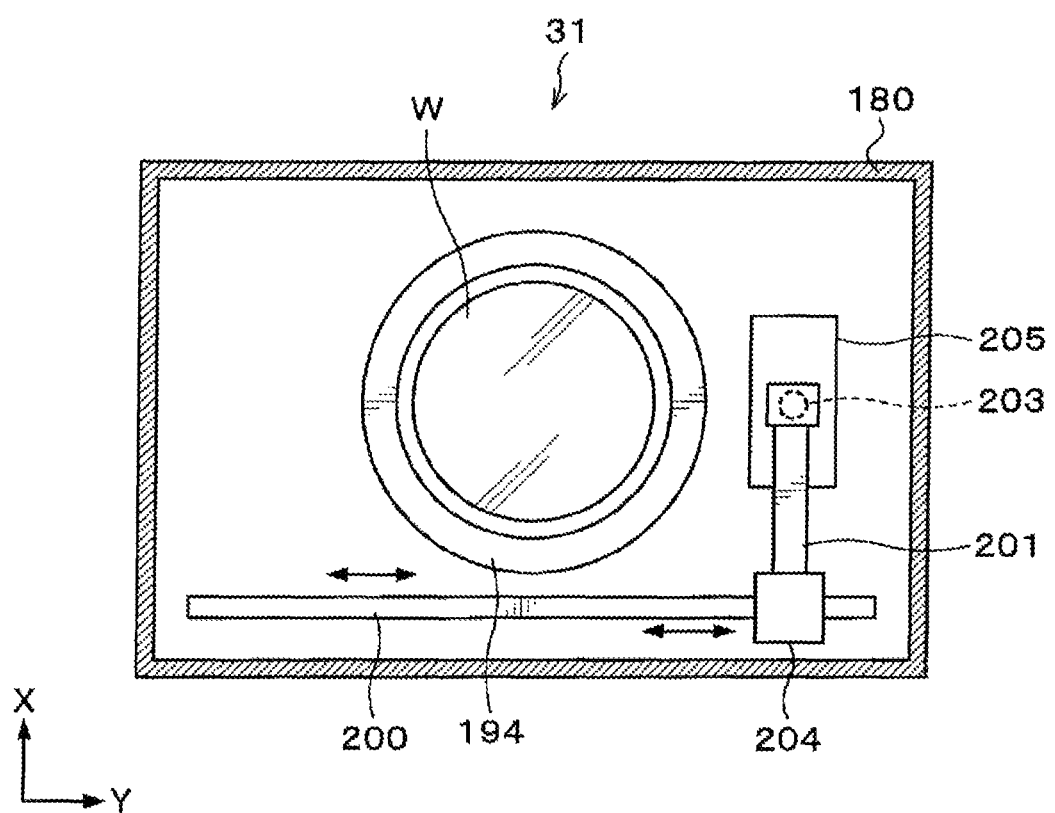
FIG. 5 is a transversal cross sectional view schematically showing the configuration of the first cleaning device.

As shown in FIG. 5, a rail 200 extending in the Y-axis direction (the left and right direction in FIG. 5) is formed at the backside of the cup 194 in the X-axis direction (at the lower side in FIG. 5) of the cup 194. The rail 200 extends from the outer backside (the left side in FIG. 5) to the outer front (the right side in FIG. 5) of the cup 194 in the Y-axis direction, for example. An arm 201 is mounted in the rail 200.

As shown in FIGS. 4 and 5, a cleaning solution nozzle 203 is supported by the arm 201 to supply a cleaning solution such as an organic solvent to the wafer to be processed W. As shown in FIG. 5, the arm 201 is movable along the rail 200 by a nozzle drive unit 204. With this configuration, the cleaning solution nozzle 203 can move from a standby section 205 provided at the outer front side of the cup 194 in the Y-axis direction to outer backside of the wafer to be processed W positioned within the cup 194, and also can move along the diameter direction of the wafer to be processed W. The arm 201 is freely moved up and down by the operation of the nozzle drive unit 204 to adjust the height of the cleaning solution nozzle 203.

For example, a two-fluid nozzle is used as the cleaning solution nozzle 203. As shown in FIG. 4, the cleaning solution nozzle 203 is connected to a supply pipe 210 through which the cleaning solution is supplied to the cleaning solution nozzle 203. The supply pipe 210 is in communication with a cleaning solution supply source 211 to store the cleaning solution therein. A supply kit 212 including a valve, a flow rate regulator or the like, which controls a flow of the cleaning solution, is installed in the supply pipe 210. The cleaning solution nozzle 203 is connected to a supply pipe 213 through which an inert gas such as a nitrogen gas is supplied to the cleaning solution nozzle 203. The supply pipe 213 is in communication with a gas supply source 214 to store the inert gas therein. A supply kit 215 including a valve, a flow rate regulator or the like, which controls a flow of the inert gas, is installed in the supply pipe 213. The cleaning solution and the inert gas are mixed inside the cleaning solution nozzle 203 so that the mixture is supplied to the wafer to be processed W. Hereinafter, in some embodiments, the mixture of the cleaning solution and the inert gas is simply referred to as a "cleaning solution."

Elevating pins (not shown) which elevate the wafer to be processed W supported from the bottom may be installed below the porous chuck 190. In such a case, the elevating pins are inserted through through-holes (not shown) formed in the porous chuck 190 in such a manner that they project from the upper surface of the porous chuck 190. Further, the wafer to be processed W may be separated from the porous chuck 190 by elevating the elevating pins upward instead of elevating the porous chuck 190. Since configurations of the bonding surface cleaning device 40 and the non-bonding surface cleaning device 41 of the aforementioned inspection-after cleaning station 8 are similar to that of the first cleaning device 31, and therefore, a description thereof will be omitted to avoid repetition.

Figure 6:
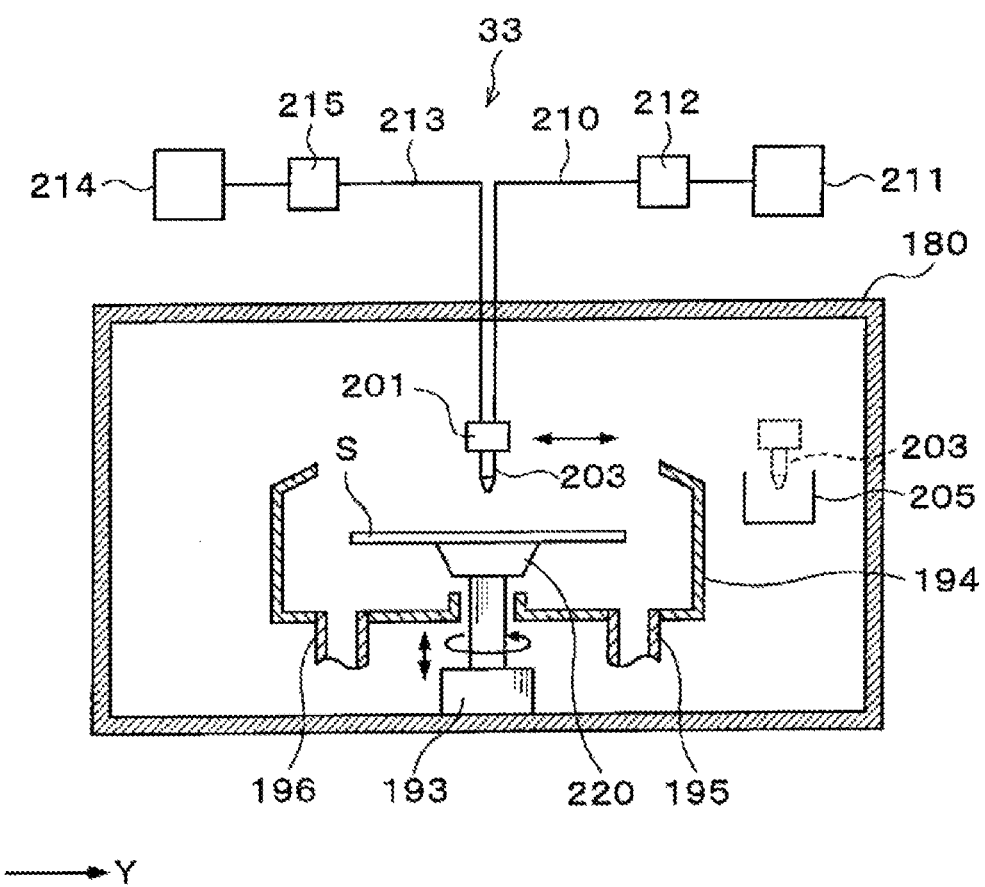
FIG. 6 is a longitudinal cross sectional view schematically showing a configuration of a second cleaning device.

The second cleaning device 33 has approximately the same configuration as that of the aforementioned first cleaning device 31. As shown in FIG. 6, in the second cleaning device 33, a spin chuck 220 is installed instead of the porous chuck 190 of the first cleaning device 31. The spin chuck 220 has a horizontal upper surface on which suction holes (not shown) for sucking, e.g., the support wafer S, is formed. By the suctioning force of the suction holes, the support wafer S can be adsorbed on the spin chuck 220. The other configurations of the second cleaning device 33 are similar to those of the first cleaning device 31, and therefore, a description thereof will be omitted to avoid repetition.

In the second cleaning device 33, a back rinse nozzle (not shown) which injects the cleaning solution toward the rear surface of the wafer to be processed W, i.e., the non-bonding surface $W_N$, may be installed below the spin chuck 220. The cleaning solution injected from the back rinse nozzle cleans the non-bonding surface $W_N$ of the wafer to be processed W and the peripheral portion thereof.

Figure 7:
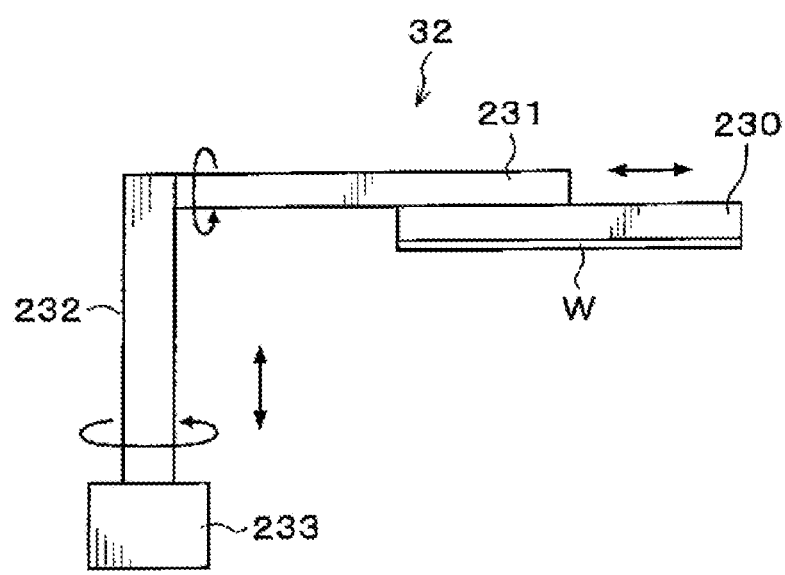
FIG. 7 is a lateral view schematically showing a configuration of the second cleaning device.

Next, a configuration of the aforementioned second transfer device 32 will be described. As shown in FIG. 7, the second transfer device 32 includes a Bernoulli chuck 230 configured to hold the wafer to be processed W. The Bernoulli chuck 230 blasts air to float the wafer to be processed W so that the wafer to be processed W can be held in a contactless state. The Bernoulli chuck 230 is supported by a support arm 231. The support arm 231 is supported by a first drive unit 232 as a rotation mechanism. By the operation of the first drive unit 232, the support arm 231 is rotatable around a horizontal axis and also horizontally expansible/contractible. A second drive unit 233 is provided below the first drive unit 232. By the operation of the second drive unit 233, the first drive unit 232 is rotatable around a vertical axis and also vertically movable.

A configuration of the transfer mechanism 51 is similar to that of the aforementioned second transfer device 32 except that the second drive unit 233 of the transfer mechanism 51 is mounted on the transfer path 50 shown in FIG. 1, and the transfer mechanism 51 is configured to be movable along the transfer path 50. Therefore, a description thereof will be omitted to avoid duplication.

Figure 8:
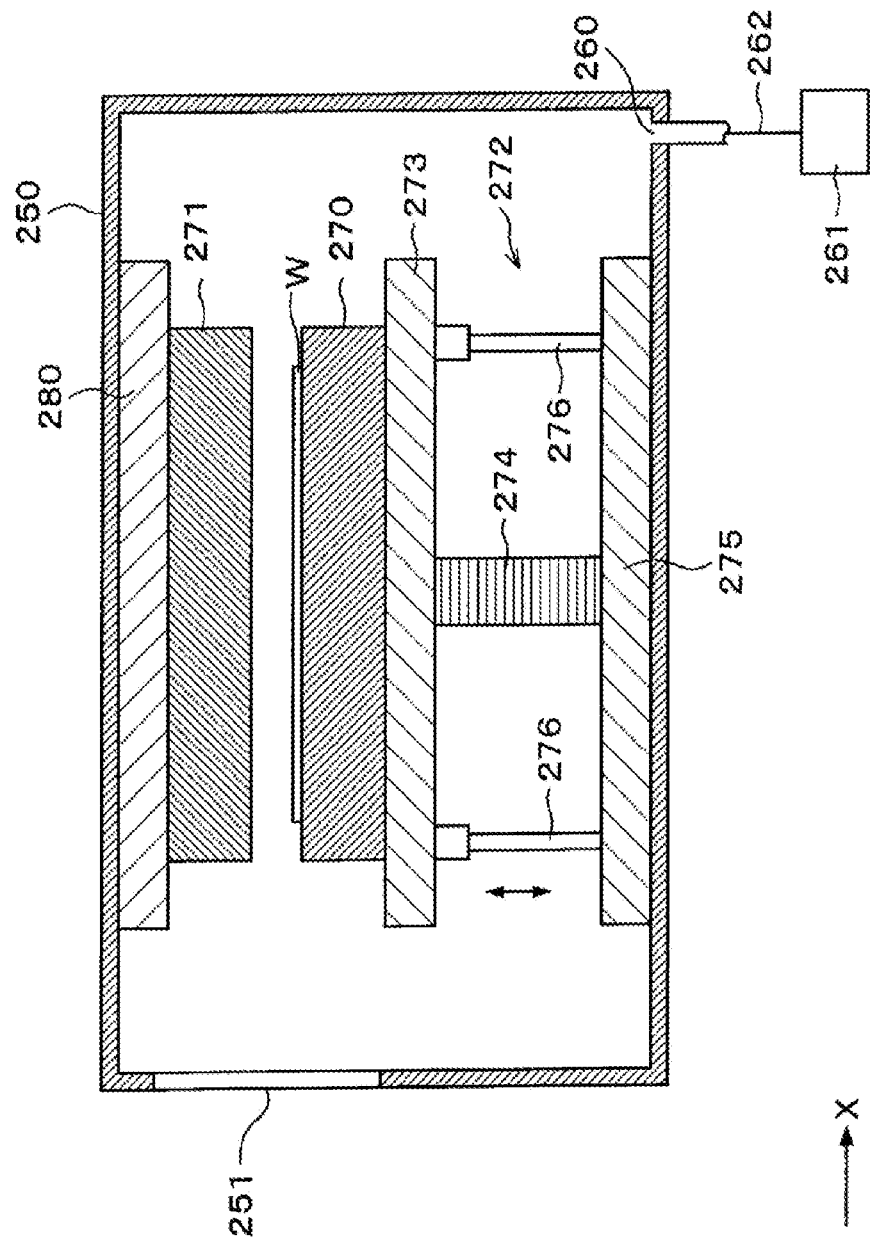
FIG. 8 is a longitudinal cross sectional view schematically showing a configuration of a wafer inverting device.

Next, a configuration of the aforementioned wafer inverting device 42 will be described. As shown in FIG. 8, the wafer inverting device 42 includes a housing 250 in which a plurality of equipment is accommodated. An inlet/outlet 251, through which the wafer to be processed W is transferred by the transfer mechanism 51, is formed in a lateral side of the housing 250. An opening/closing shutter (not shown) is installed at the inlet/outlet 251.

An exhaust port 260 is formed at a bottom of the housing 250 so that the internal atmosphere of the housing 250 is exhausted through the exhaust port 260. An exhaust pipe 262, which is in communication with an exhaust device 261, such as a vacuum pump, is connected to the exhaust port 260.

A first holding unit 270 configured to hold the wafer to be processed W on the upper surface thereof and a second holding unit 271 configured to hold the wafer to be processed W on the bottom surface thereof are installed in the housing 250. The second holing part 271 is disposed above the first holding unit 270 while being positioned to face the first holding unit 270. The first holding unit 270 and the second holding unit 271 have substantially the same diameter as that of, e.g., the wafer to be processed W. A Bernoulli chuck is used as examples of the first holding unit 270 and the second holding unit 271. This configuration is allowed each of the first holding unit 270 and the second holding unit 271 to hold the entire region of one surface of the wafer to be processed W in a contactless manner. In addition, the first holding unit 270 and the second holding unit 271 may not have substantially the same diameter as that of the wafer to be processed W. In some embodiments, the diameters of the first holding unit 270 and second holding unit 271 may be set to be smaller or greater than, e.g., that of the wafer to be processed W as long as they hold the entire region of one surface of the wafer to be processed W. Although the entire region of one surface of the wafer to be processed W has been described as being held, the entire region of one surface of the wafer to be processed W may not be substantially held. That is, the entire region of one surface of the wafer to be processed W is held to such an extent that a thinned wafer to be processed W is not bent or cracked. Therefore, although the diameter of a Bernoulli chuck as the holding unit is smaller than that of a substrate, it can be considered that the entire region of one surface of the wafer to be processed W is held as long as the wafer to be processed W is held to be not bent or cracked.

Moreover, the Bernoulli chuck 230 is used as the second transfer device 32, and the transfer mechanism 51 is configured to hold the entire region of one surface of the wafer to be processed W similarly to the first holding unit 270 and the second holding unit 271.

A moving mechanism 272 configured to vertically move the first holding unit 270 is installed below the first holding unit 270. The moving mechanism 272 includes a support plate 273 for supporting a bottom surface of the first holding unit 270, and a drive unit 274 configured to vertically move the support plate 273 such that the first holding unit 270 and the second holding unit 271 approach each other and are spaced apart from each other. The drive unit 274 is supported by a support body 275 which is disposed on a bottom of the housing 250. Support members 276 which support the support plate 273 is installed on an upper surface of the support body 275. The support members 276, which are configured to be vertically expansible/contractible when the support plate 273 moves by the operation of the drive unit 274 upward and downward.

A support plate 280 configured to support the second holding unit 271 is disposed on the upper surface of the second holding unit 271. As described above, the transfer mechanism 51 is included in equipment which constitutes the wafer inverting device 42. In some embodiments, the support plate 280 may be omitted, and the second holding unit 271 may be supported by being in contact with the ceiling surface of the housing 250.

Figure 9:
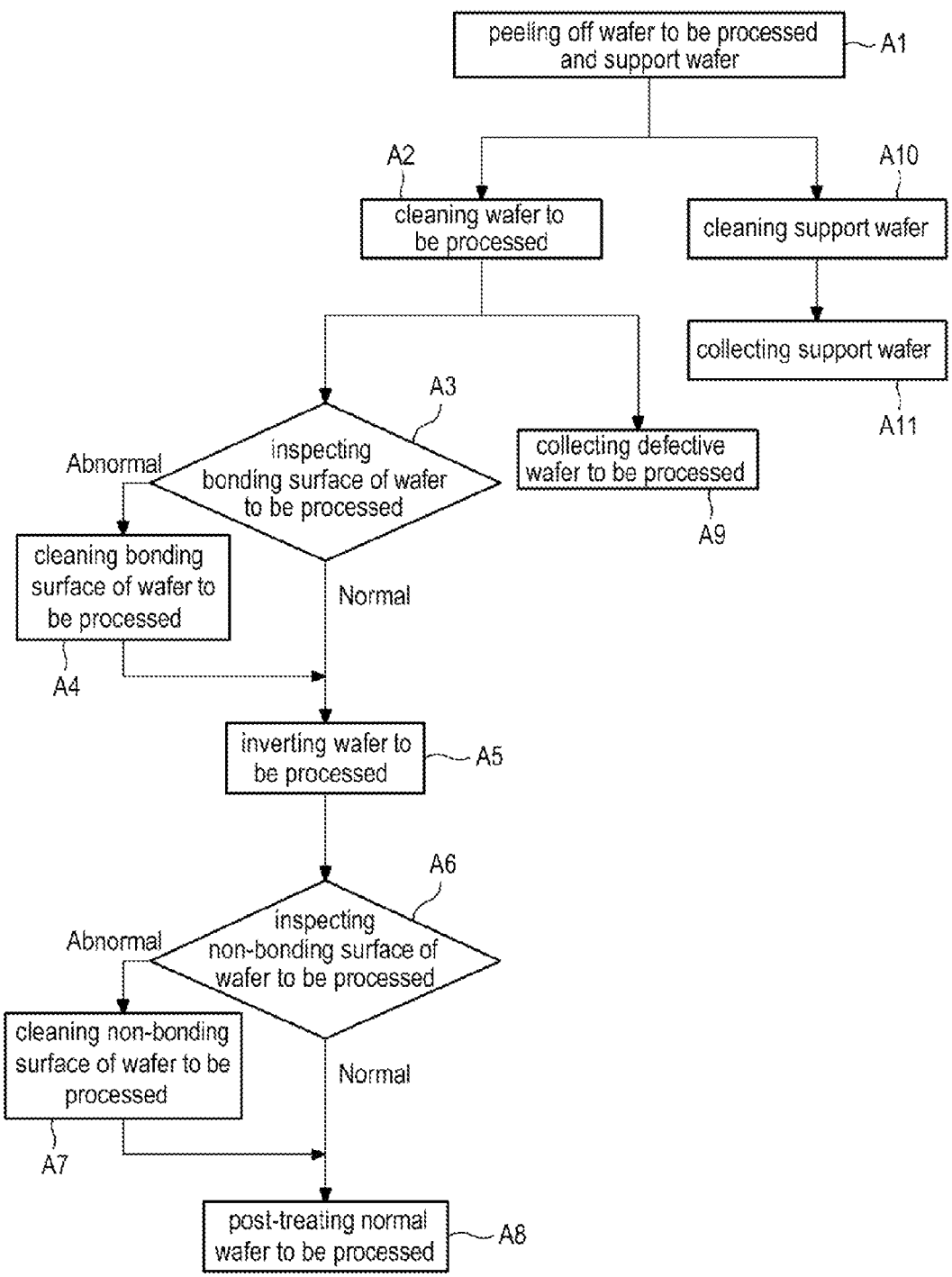
FIG. 9 is a flowchart showing main operations of a peeling process.

As shown in FIG. 1, the aforementioned peeling system 1 includes a control unit 300. The control unit 300 is, for example, a computer, and includes a program storage (not shown). The program storage stores a program which controls processing of the wafer to be processed W, the support wafer S, and the overlapped wafer T in the peeling system 1. The program storage also stores a program which controls operations of a driving system including the aforementioned processing devices and the transfer units to implement a peeling process in the peeling system 1, which will be described later. The programs may be installed in the control unit 300 from a computer readable storage medium H such as a hard disk (HD), a flexible disk (FD), a compact disk (CD), a magneto-optical disk (MO), a memory card or the like. Next, a peeling process of the wafer to be processed W and the support wafer S, to be performed using the peeling system 1 configured as above, will be described. FIG. 9 is a flowchart illustrating main operations of the peeling process.

First, a cassette $C_T$ with a plurality of overlapped wafers T accommodated therein, an empty cassette $C_W$, and an empty cassette $C_S$ are loaded on a respective cassette loading plate 11 of the carry-in/carry-out station 2. Thereafter, each of the overlapped wafers T within the cassette $C_T$ is taken out by the first transfer device 20 and then is transferred to the peeling device 30 of the peeling process station 3. At this time, the overlapped wafer T is transferred with the wafer to be processed W positioned at the upper side and the support wafer S positioned at the lower side.

Figure 10:
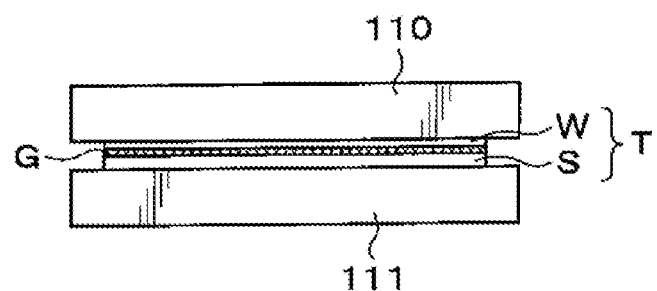
FIG. 10 is a view showing a state where a overlapped wafer is held by a first holding unit and a second holding unit.

The overlapped wafer T loaded into the peeling device 30 is adsorbed to the lower chuck 111. Thereafter, the lower chuck 111 is elevated by the moving mechanism 150 so that, as shown in FIG. 10, the overlapped wafer T is held by the upper chuck 110 and the lower chuck 111 with the overlapped wafer T interposed therebetween. At this time, the non-bonding surface $W_N$ of the wafer to be processed W is adsorbed to the upper chuck 110, and the non-bonding surface $S_N$ of the support wafer S is adsorbed to the lower chuck 111.

Thereafter, the overlapped wafer T is heated to a predetermined temperature, e.g., 200 degrees C., by the heating mechanisms 124 and 141. Thus, the adhesive G in the overlapped wafer T is softened.

Figure 11:
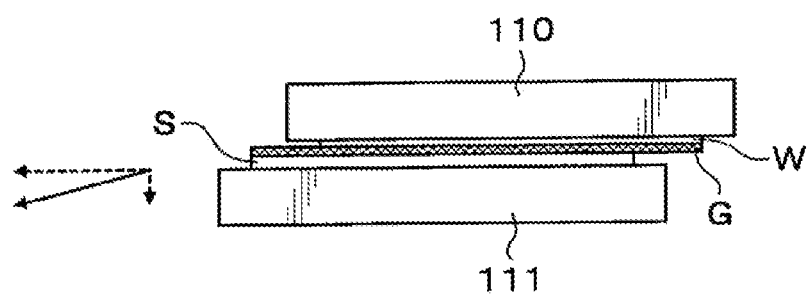
FIG. 11 is a view showing a state where the second holding unit is moved in vertical and horizontal directions.
Figure 12:
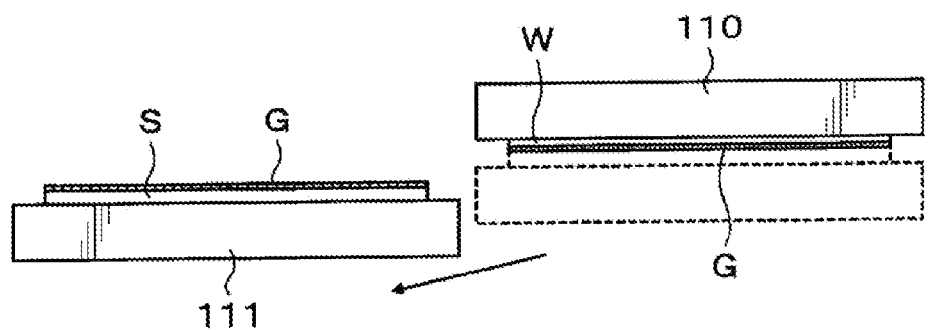
FIG. 12 is a view showing a state where the wafer to be processed and the support wafer are peeled off from each other.

Subsequently, while the heating mechanisms 124 and 141 heat the overlapped wafer T to maintain the soft state of the adhesive G, the moving mechanism 150 moves the lower chuck 111 and the support wafer S in vertical and horizontal directions, i.e., obliquely downward, as shown in FIG. 11. Then, as shown in FIG. 12, the wafer to be processed W held by the upper chuck 110 and the support wafer S held by the lower chuck 111 are peeled off from each other (Operation A1 in FIG. 9).

At this time, the lower chuck 111 is moved by a distance of 100 μm in the vertical direction and by a distance of 300 mm in the horizontal direction. In this embodiment, a thickness of the adhesive G in the overlapped wafer T is in the range of, e.g., 30 μm to 40 μm, and a height of an electronic circuit (bump) formed on the bonding surface $W_J$ of the wafer to be processed W is, e.g., 20 μm. Accordingly, a distance between the electronic circuit formed on the wafer to be processed W and the support wafer S becomes very small. As such, for example, when the lower chuck 111 is moved only in the horizontal direction, the electronic circuit is brought into contact with the support wafer S, which may cause damages to the electronic circuit. In this embodiment, the electronic circuit is not brought into contact with the support wafer S because the lower chuck 111 is moved simultaneously in both the horizontal and vertical directions, thus preventing the electronic circuit from being damaged. A ratio of a vertical movement distance to a horizontal movement distance of the lower chuck 111 may be set based on the height of the electronic circuit (bump) formed on the wafer to be processed W.

Thereafter, the wafer to be processed W peeled by the peeling device 30 is transferred to the first cleaning device 31 by the second transfer device 32. Hereinafter, the transfer of the wafer to be processed W by the second transfer device 32 will be described.

Figure 13:
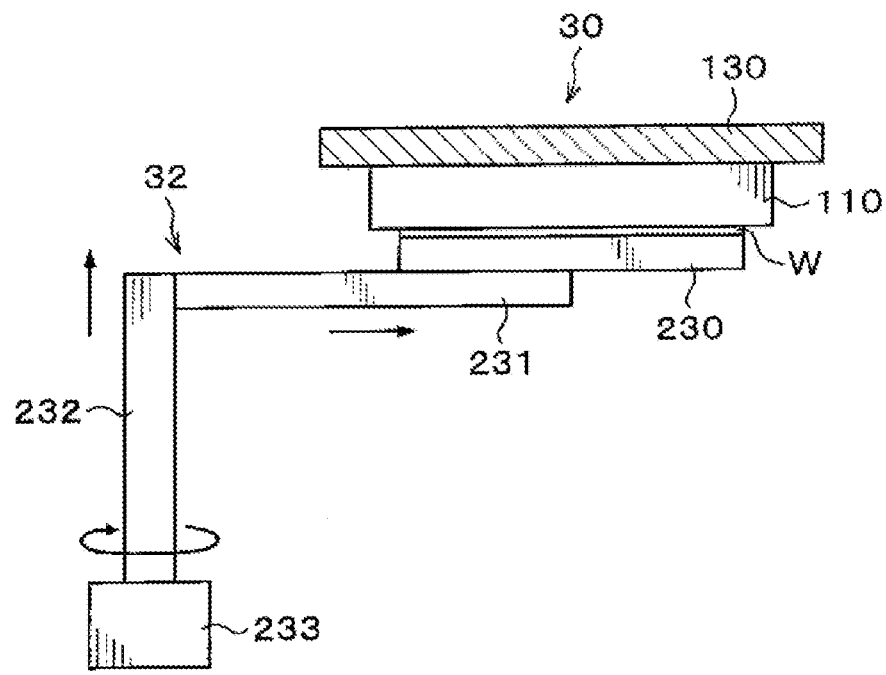
FIG. 13 is a view showing a state where the wafer to be processed is transferred from the first holding unit to a Bernoulli chuck.

As shown in FIG. 13, the support arm 231 is extended such that the Bernoulli chuck 230 is positioned below the wafer to be processed W which is held by the upper chuck 110. Thereafter, the Bernoulli chuck 230 is lifted up to release the suction of the wafer to be processed W by the suction pipe 123 in the upper chuck 110. Then, the wafer to be processed W is transferred from the upper chuck 110 to the Bernoulli chuck 230. At this time, although the bonding surface $W_J$ of the wafer to be processed W is held by the Bernoulli chuck 230, since the Bernoulli chuck 230 holds the wafer to be processed W in a contactless manner, the electronic circuit formed on the bonding surface $W_J$ of the wafer to be processed W are not damaged.

Figure 14:
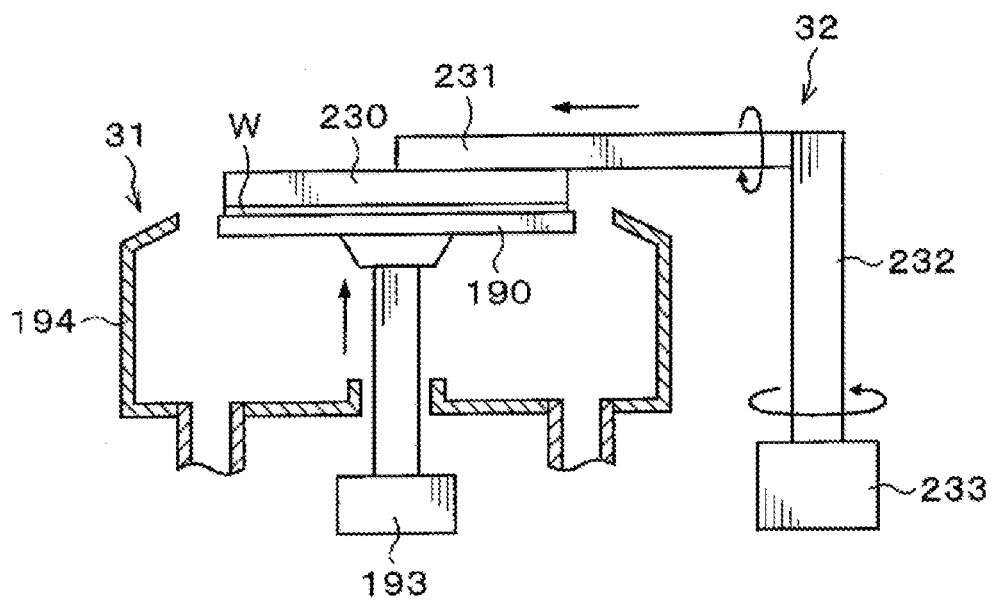
FIG. 14 is a view showing a state where the wafer to be processed is transferred from the Bernoulli chuck to a porous chuck.

Next, as shown in FIG. 14, the support arm 231 rotates such that the Bernoulli chuck 230 is lifted above the porous chuck 190 of the first cleaning device 31. Simultaneously, the Bernoulli chuck 230 is inverted such that the wafer to be processed W is oriented downward. At this time, the porous chuck 190 is elevated above the cup 194 and is on standby. Thereafter, the wafer to be processed W is transferred from the Bernoulli chuck 230 to the porous chuck 190 and then is adsorbed to the porous chuck 190.

As described above, when the wafer to be processed W is adsorbed to the porous chuck 190, the porous chuck 190 is lowered to a predetermined position. Subsequently, the cleaning solution nozzle 203 positioned within the standby section 205 is moved, by the arm 201, above the central portion of the wafer to be processed W. Thereafter, the cleaning solution is supplied from the cleaning solution nozzle 203 onto the bonding surface $W_J$ of the wafer to be processed W while rotating the wafer to be processed W by the porous chuck 190. The supplied cleaning solution is spread to the entire surface of the bonding surface $W_J$ of the wafer to be processed W due to a centrifugal force of the rotation, and the bonding surface $W_J$ of the wafer to be processed W is cleaned (Operation A2 in FIG. 9).

As described above, the plurality of the overlapped wafers T loaded into the carry-in/carry-out station 2 is previously inspected to distinguish between a normal overlapped wafer T including a normal wafer to be processed W and an abnormal overlapped wafer T including an abnormal wafer to be processed W.

The bonding surface $W_J$ of the normal wafer to be processed W peeled off from the normal overlapped wafer T is cleaned in operation A2 and then transferred to the inspection device 6 by the transfer mechanism 51 with the non-bonding surface $W_N$ oriented downward. The transfer of the wafer to be processed W by the transfer mechanism 51 is substantially similar to that of the wafer to be processed W by the aforementioned second transfer device 32. Thus, a description thereof will be omitted to avoid repetition.

The inspection device 6 inspects whether the residual of the adhesive G exists on the bonding surface $W_J$ of the wafer to be processed W, which is transferred to the inspection device 6 with the non-bonding surface $W_N$ oriented downward, i.e., with the bonding surface $W_J$ oriented upward (Operation A3 in FIG. 9). If the inspection device 6 determines that the residual of the adhesive G exists, the transfer mechanism 51 transfers the wafer to be processed W to the bonding surface cleaning device 40 of the inspection-after cleaning station 8 where the bonding surface $W_J$ is cleaned (Operation A4 in FIG. 9). Even in such case, since the transfer mechanism 51 holds the wafer to be processed W in a contactless manner, the residual of the adhesive G existing on the bonding surface $W_J$ of the wafer to be processed W is not adhered onto the transfer mechanism 51. This prevents the residual of the adhesive G from being adhered onto a subsequent wafer to be processed W.

After the bonding surface $W_J$ is cleaned, the transfer mechanism 51 transfers the wafer to be processed W to the wafer inverting device 42 where front and rear surfaces of the wafer to be processed W is inverted upside down (Operation A5 in FIG. 9). Next, an inverting process of the wafer to be processed W by the wafer inverting device 42 will be described.

Figure 15:
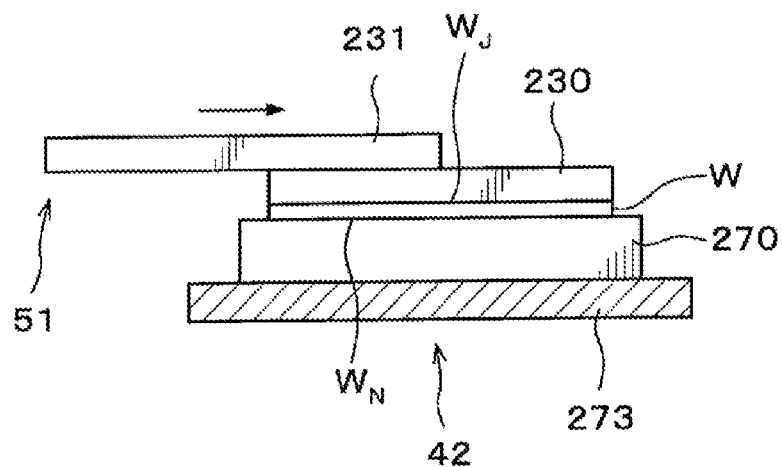
FIG. 15 is a view showing a state where the wafer to be processed is transferred from the Bernoulli chuck to the first holding unit.

As shown in FIG. 15, the wafer to be processed W whose the bonding surface $W_J$ is cleaned by the bonding surface cleaning device 40 is transferred to the wafer inverting device 42 while being held the bonding surface $W_J$ by the Bernoulli chuck 230 of the transfer mechanism 51. Subsequently, the wafer to be processed W is transferred to the first holding unit 270 of the wafer inverting device 42 with the bonding surface $W_J$ oriented upward where the entire region of one surface of the wafer to be processed W, e.g., the entire surface of the non-bonding surface $W_N$ in this embodiment, is held by the first holding unit 270.

Figure 16:
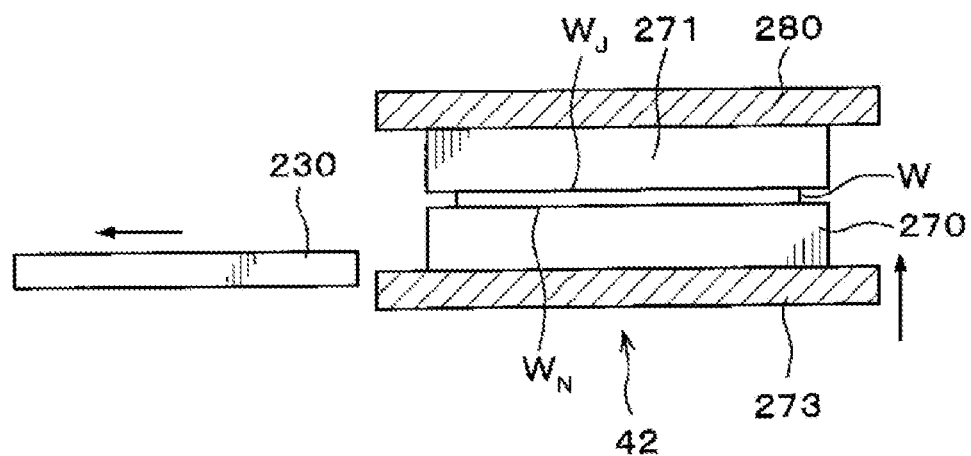
FIG. 16 is a view showing a state where the wafer to be processed is transferred from the first holding unit to the second holding unit.
Figure 17:
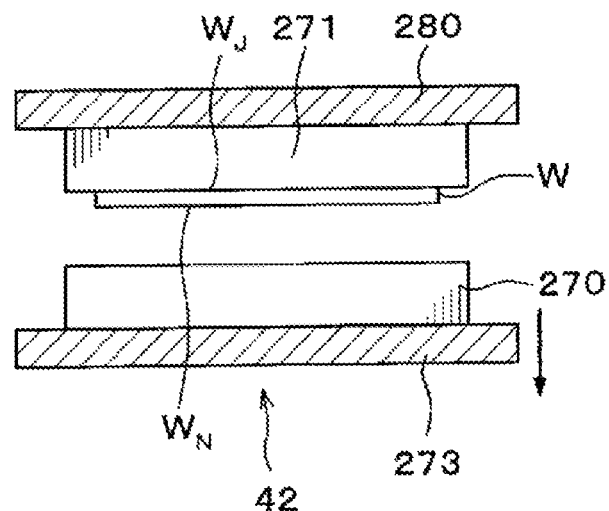
FIG. 17 is a view showing a state where the wafer to be processed is transferred from the first holding unit to the second holding unit.

Subsequently, the Bernoulli chuck 230 is retreated from the first holding unit 270 and the first holding unit 270 is lifted up by the drive unit 274 such that, as shown in FIG. 16, the first holding unit 270 approaches the second holding unit 271. Thereafter, the second holding unit 271 holds the bonding surface $W_J$ of the wafer to be processed W and the first holding unit 270 releases the support of the wafer to be processed W so that the wafer to be processed W is transferred to the second holding unit 271. Thus, as shown in FIG. 17, the wafer to be processed W is held by the second holding unit 271 with the non-bonding surface $W_N$ thereof oriented downward.

Figure 18:
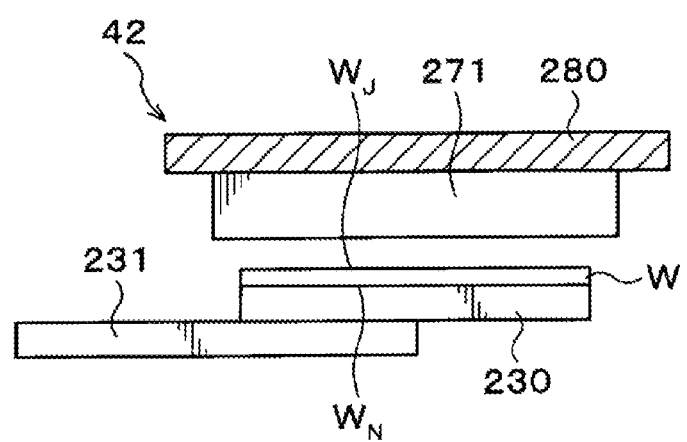
FIG. 18 is a view showing a state where the wafer to be processed is transferred from the second holding unit to the Bernoulli chuck.

After that, the first holding unit 270 is lowered so that the first holding unit 270 and the second holding unit 271 are spaced apart from each other. Subsequently, the retreated Bernoulli chuck 230 of the transfer mechanism 51 rotates around its horizontal axis. And then, the Bernoulli chuck 230, while being oriented upward, is disposed below the second holding unit 271. Subsequently, the Bernoulli chuck 230 is lifted up and simultaneously, the second holding unit 271 releases the support of the wafer to be processed W. With this configuration, as shown in FIG. 18, in the wafer to be processed W, when it is unloaded from the bonding surface cleaning device 40, a state where the entire region of the bonding surface $W_J$ is held by the Bernoulli chuck 230 is changed into a state where the entire region of the non-bonding surface $W_N$ is held by the Bernoulli chuck 230. Specifically, the front and rear surfaces of the wafer to be processed W which is held by the Bernoulli chuck 230 are inverted upside down. Thereafter, the Bernoulli chuck 230 is retreated from the wafer inverting device 42 while holding the non-bonding surface $W_N$ of the wafer to be processed W.

Meanwhile, if no residual of the adhesive G is determined to exist by the inspection device 6, the wafer inverting device 42 inverts the wafer to be processed W without being transferred to the bonding surface cleaning device 40. This inverting operation is similar to the aforementioned inverting operation.

Subsequently, the Bernoulli chuck 230 rotates around its horizontal axis while holding the wafer to be processed W so that the wafer to be processed W is inverted upside down. The wafer to be processed W is again transferred to the inspection device 6 by the Bernoulli chuck 230 with the non-bonding surface $W_N$ oriented upward such that the non-bonding surface $W_N$ is subjected to the inspection by the inspection device 6 (Operation A6 of FIG. 9). If the residual of the adhesive G is determined to exist in the non-bonding surface $W_N$, the wafer to be processed W is transferred to the non-bonding surface cleaning unit 8c by the transfer mechanism 51 where the non-bonding surface $W_N$ is cleaned (Operation A7 in FIG. 9). Subsequently, the cleaned wafer to be processed W is transferred to the post-treatment station 4 by the transfer mechanism 51. Meanwhile, if no residual of the adhesive G is determined to exist by the inspection device 6, the wafer to be processed W is transferred to the post-treatment station 4 as it is without being transferred to the non-bonding surface cleaning device 41.

Thereafter, the wafer to be processed W is subjected to a predetermined post-treatment in the post-treatment station 4 (Operation A8 in FIG. 9). In this manner, the wafer to be processed W is used as a product.

On the other hand, the bonding surface $W_J$ of the abnormal wafer to be processed W peeled off from the abnormal (or defective) overlapped wafer T is cleaned in Operation A2 and then transferred to the carry-in/carry-out station 2 by the first transfer device 20. Thereafter, the abnormal wafer to be processed W is discharged from the carry-in/carry-out station 2 to the outside for the collection (Operation A9 in FIG. 9).

While the aforementioned operations A1 to A9 are performed on the wafer to be processed W, the support wafer S peeled off from the peeling device 30 is transferred to the second cleaning device 33 by the first transfer device 20. In the second cleaning device 33, the bonding surface $S_J$ of the support wafer S is cleaned (Operation A10 in FIG. 9). The cleaning of the support wafer S in the second cleaning device 33 is similar to that of the wafer to be processed W in the aforementioned first cleaning device 31, and therefore, a description thereof will be omitted to avoid repetition.

Thereafter, the support wafer S having the cleaned bonding surface $S_J$ is transferred to the carry-in/carry-out station 2 by the first transfer device 20. The support wafer S is then discharged from the carry-in/carry-out station 2 to the outside for the collection (Operation A11 in FIG. 9). In this manner, a series of the peeling processes for the wafer to be processed W and the support wafer S are terminated.

According to the above embodiments, the first holding unit 270, the second holding unit 271, and the moving mechanism 272 are provided. The first holding unit 270 and the second holding unit 271 are installed to face each other, and the moving mechanism 272 moves the first holding unit 270 and the second holding unit 271 to approach each other and be spaced apart from each other. With this configuration, for example, the wafer to be processed W is transferred to the first holding unit 270 by the transfer mechanism 51 so that one surface of the wafer to be processed W is held by the first holding unit 270, and subsequently, the first holding unit 270 and the second holding unit 271 approach each other so that the wafer to be processed W is transferred to the second holding unit 271, which is allowed an opposite surface of a surface of the wafer to be processed W held by the first holding unit 270 to be held by the second holding unit 271. Specifically, a surface of the wafer to be processed W held by one holding unit can be alternately held by another holding unit. Further, the transfer mechanism 51 further holds the wafer to be processed W which is held by the second holding unit 271 so that the front and rear surfaces of the wafer to be processed W which is held by the transfer mechanism 51 are inverted upside down. Further, in this embodiment, since the Bernoulli chuck is used as the first holding unit 270 and the second holding unit 271, it is possible to invert the front and rear surfaces of the wafer to be processed W which is thinned by a polishing process without causing a bending or a crack.

Moreover, this embodiment provides the first drive unit 232 as a rotation mechanism, which rotates the Bernoulli chuck 230 of the transfer mechanism 51 around its horizontal axis. With this configuration, the Bernoulli chuck 230, which holds the wafer to be processed W having reversed front and rear surfaces, is further rotated around the horizontal axis, thereby making it possible to invert the wafer to be processed W upside down.

While in the above embodiments, the first holding unit 270 and the second holding unit 271 have been described to vertically approach each other and be spaced apart from each other by the elevation of the first holding unit 270, various moving method may be applied so long as it vertically moves the first holding unit 270 and the second holding unit 271 to approach each other and be spaced apart from each other. As an example, only the second holding unit 271 may be vertically moved. Alternatively, both the first holding unit 270 and the second holding unit 271 may be vertically moved.

While in the above embodiments, the inversion of the front and rear surfaces of the wafer to be processed W has been described to be performed by holding the wafer to be processed W by the first holding unit 270, followed by transferring the same to the second holding unit 271, the present disclosure is not limited thereto. In some embodiments, the inversion may be performed by first holding the wafer to be processed W by the second holding unit 271, followed by transferring the same to the first holding unit 270.

According to the above embodiments, after the wafer to be processed W and the support wafer S are peeled off from the overlapped wafer T in the peeling device 30, the peeled-off wafer to be processed W can be cleaned by the first cleaning device 31 and the peeled-off support wafer S can be cleaned by the second cleaning device 33. As described above, according to the above embodiments, a series of processes including peeling the wafer to be processed W and the support wafer S and cleaning the wafer to be processed W and the support wafer S can be effectively performed in the single peeling system 1. In addition, the cleaning of the wafer to be processed W and the cleaning of the support wafer S are simultaneously performed in the first cleaning device 31 and the second cleaning device 33, respectively. Furthermore, while the wafer to be processed W and the support wafer S are peeled off from each other in the peeling device 30, another wafer to be processed W and another support wafer S may also be processed in the first cleaning device 31 and the second cleaning device 33, respectively. Therefore, it is possible to efficiently perform the peeling of the wafer to be processed W and the support wafer S, which improves a throughput of the peeling process.

In the above embodiments, since the inspection device 6 is configured to inspect the wafer to be processed W, it is possible to correct process conditions to be applied in the peeling system 1 based on results of the inspection. This makes it possible to stably peel off the wafer to be processed W and the support wafer S.

Further, the inspection-after cleaning station 8 of this embodiment is configured to include the bonding surface cleaning device 40 and the non-bonding surface cleaning device 41, thus preventing the residual of the adhesive G from being introduced to a subsequent process. Further, the inspection-after cleaning station 8 is configured to include the wafer inverting device 42, which makes it possible to efficiently clean the bonding surface $W_J$ and non-bonding surface $W_N$ of the peeled-off wafer to be processed W in the peeling system 1.

In addition, when the wafer to be processed W peeled by the peeling process station 3 is the normal wafer to be processed W, it is subjected to the predetermined post-treatment in the post-treatment station 4 to use the same as a product. On the other hand, when the wafer to be processed W peeled by the peeling process station 3 is the abnormal wafer to be processed W, it is collected by the carry-in/carry-out station 2. Accordingly, since only the normal wafer to be processed W is used as the product, it is possible to improve the production yield. Further, the abnormal wafer to be processed W is collected. The collected wafer to be processed W may be reused depending on an abnormal degree, leading to an effective use of resources and reduction in manufacturing costs.

The series of processes as described above, including the peeling of the wafer to be processed W and the support wafer S and the post-treatment of the wafer to be processed W, are performed thus further improving the production yield of process for the wafer.

In addition, the support wafer S peeled by the peeling device 30 is cleaned and then is collected by the carry-in/carry-out station 2 so that the support wafer S can be reused. This makes an effective use of resources and reduces manufacturing costs.

Furthermore, the peeling device 30 moves the lower chuck 111 and the support wafer S in the vertical and horizontal directions using the moving mechanism 150 while heating the overlapped wafer T such that the wafer to be processed W and the support wafer support substrate are peeled off from each other. The movement of the lower chuck 111 in both the vertical and horizontal directions prevents the electronic circuit formed on the wafer to be processed W from being brought into contact with the support wafer S even when a distance therebetween is very small. Thus, it is possible to avoid the contact between the wafer to be processed W and the support wafer S. This prevents the electronic circuit from being damaged and facilitates the peeling process of the wafer to be processed W and the support wafer S.

In addition, since each of the second transfer device 32 and the transfer mechanism 51 is equipped with the Bernoulli chuck 230 configured to hold the wafer to be processed W, it is possible to stably hold the wafer to be processed W even for a thin one. Further, in the second transfer device 32 and the transfer mechanism 51, since the Bernoulli chuck 230 holds the bonding surface $W_J$ of the wafer to be processed W in a contactless manner, it is possible to prevent the electronic circuit formed on the bonding surface $W_J$ of the wafer to be processed W from being damaged.

Since the first cleaning device 31 includes the porous chuck 190 configured to hold the wafer to be processed W, it is possible to stably hold the wafer to be processed W even for a thin one.

While in the above embodiments, the lower chuck 111 has been described as being moved in the vertical and horizontal directions in the peeling device 30, the upper chuck 110 may be moved in the vertical and horizontal directions. Alternatively, both the upper chuck 110 and the lower chuck 111 may be moved in the vertical and horizontal directions.

While the lower chuck 111 has been described as being moved in the both vertical and horizontal directions in the peeling device 30, the lower chuck 111 may be moved only in the horizontal direction and a moving speed thereof may be varied. As an example, an initial moving speed of the lower chuck 111 may be set to a lower level and be gradually increased. That is, when the lower chuck 111 starts to move, since a bonding area between the wafer to be processed W and the support wafer S is large so that the electronic circuit formed on the wafer to be processed W can be easily influenced by the adhesive G, the initial moving speed of the lower chuck 111 is set to a lower level. As the bonding area between the wafer to be processed W and the support wafer S becomes small, the influence of the adhesive G on the electronic circuit formed on the wafer to be processed W becomes smaller, the moving speed of the lower chuck 111 is gradually increased. This avoids the contact between the electronic circuit and the support wafer S and prevents the electronic circuit from being damaged.

While in the above embodiments, the lower chuck 111 has been described to be moved in the vertical and horizontal directions in the peeling device 30, when a distance between the electronic circuit formed on the wafer to be processed W and the support wafer S is sufficiently large, the lower chuck 111 may be moved only in the horizontal direction. This configuration prevents the electronic circuit from being brought into contact with the support wafer S and also simplifies controlling the movement of the lower chuck 111. In some embodiments, the lower chuck 111 may be moved only in the vertical direction to peel off the wafer to be processed W and the support wafer S from each other. Alternatively, an end of a peripheral portion of the lower chuck 111 may be moved only in the vertical direction to peel off the wafer to be processed W and the support wafer S from each other.

While in the above embodiments, the wafer to be processed W and the support wafer S have been described to be peeled off while positioning the wafer to be processed W at the upper side and the support wafer S at the lower side, the positions of the wafer to be processed W and the support wafer S may be inverted.

In the second transfer device 32 according to the above embodiments, a plurality of supply holes (not shown) through which the cleaning solution is supplied may be formed on a surface of the Bernoulli chuck 230. With this configuration, when the wafer to be processed W is transferred from the Bernoulli chuck 230 to the porous chuck 190 of the first cleaning device 31, the cleaning solution is supplied from the Bernoulli chuck 230 onto the bonding surface $W_J$ of the wafer to be processed W, thus cleaning the bonding surface $W_J$ and also the Bernoulli chuck 230 itself. This reduces the amount of time required to clean the wafer to be processed W in the first cleaning device 31 later, which improves a production yield in the peeling process. Furthermore, since the Bernoulli chuck 230 can be cleaned, it is possible to transfer a subsequent wafer to be processed W in a reliable manner.

In the above embodiments, the two-fluid nozzle has been described to be used as the cleaning solution nozzle 203 of the first cleaning device 31 and the second cleaning device 33, but is not limited thereto, various types of nozzles may be used. As an example, a nozzle body in which a nozzle configured to supply a cleaning solution and a nozzle configured to supply an inert gas are combined, a spray nozzle, a jet nozzle, a megasonic nozzle, or the like may be used as the cleaning solution nozzle 203. In addition, in order to improve a production yield in the cleaning process, a cleaning solution heated to, e.g., 80 degrees C., may be supplied.

In some embodiments, in addition to the cleaning solution nozzle 203, a nozzle configured to supply IPA (isopropyl alcohol) may be provided in the first cleaning device 31 and the second cleaning device 33. In such a case, after the wafer to be processed W or the support wafer S is cleaned by the cleaning solution supplied from the cleaning solution nozzle 203, the cleaning solution supplied onto the wafer to be processed W or the support wafer S is substituted with the IPA. This makes it possible to more reliably clean the bonding surface $W_J$ of the wafer to be processed W or the bonding surface $S_J$ of the support wafer S.

The peeling system 1 according to the above embodiments may include a temperature adjusting unit (not shown) which cools the wafer to be processed W heated in the peeling device 30 up to a predetermined temperature. This makes it possible to adjust the temperature of the wafer to be processed W to a suitable temperature, thus smoothly performing a subsequent process.

Figure 19:
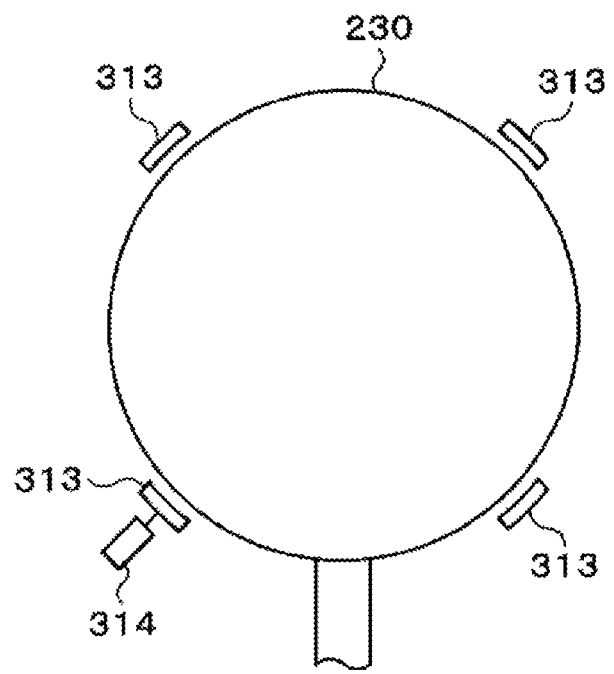
FIG. 19 is a view showing another example of the Bernoulli chuck.
Figure 20:
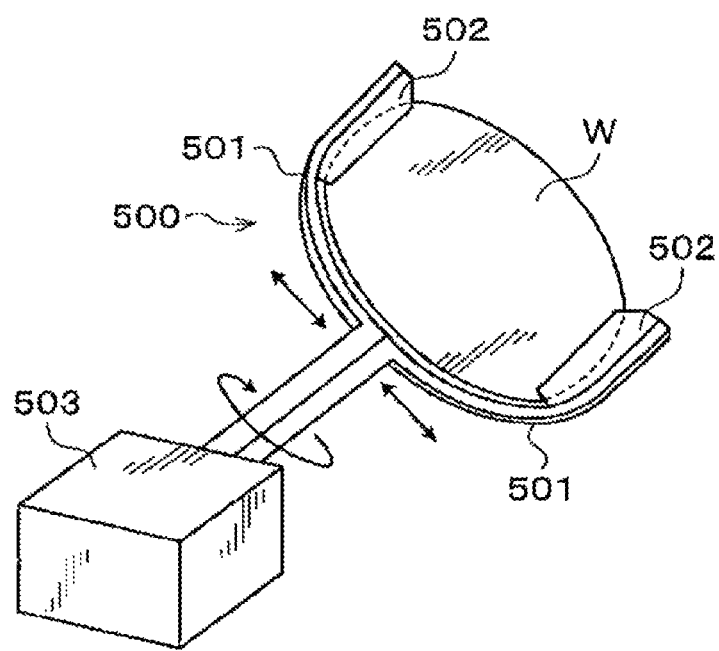
FIG. 20 is a view schematically showing a configuration of a conventional wafer inverting arm.

In some embodiments, as shown in FIG. 19, as another example of the Bernoulli chuck 230, a plurality of holding guides 313 configured to hold the periphery of the wafer to be processed W may be provided in the periphery of the Bernoulli chuck 230. This configuration prevents the wafer to be processed W held by the Bernoulli chuck 230 from being dislocated. In some embodiments, a plurality of guide moving units 314 may be further provided to allow the respective holding guides 313 to approach the wafer to be processed W or be spaced apart from each other.

Furthermore, some portions of the above embodiments may be combined with each other, while obtaining the same operation and effects as the above embodiments.

While in the above embodiments, the wafer to be processed W has been described to be subjected to the post-treatment in the post-treatment station 4 for the product, the present disclosure is not limited thereto. For example, the present disclosure may be applied when a wafer to be processed used in, e.g., three-dimensional integration technique, is peeled off from a support wafer. The three-dimensional integration technique is a technique to meet a recent demand for high density integration of semiconductor devices, in which a plurality of highly-integrated semiconductor devices are stacked in three dimensions, instead of placing the plurality of semiconductor devices on a horizontal plane. Even in this three-dimensional integration technique, there is a desire to stack thin the wafer to be processed. The thin wafer to be processed is bonded to a support wafer and subsequently, a predetermined process is performed onto the bonded wafers.

While in the above embodiments, the inverting process has been described to be performed onto the wafer to be processed W that is thinned by the polishing process, the present disclosure may be applied in inverting a general wafer before the wafer to be processed W is thinned.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures. The present disclosure may be applied to other various substrates including a flat panel display (FPD), a mask reticle for photomask and so on, in addition to the wafers.

EXPLANATION OF REFERENCE NUMERALS 1 peeling system
2 carry-in/carry-out station
3 peeling process station
4 post-treatment station
5 interface station
6 inspection device
7 transfer station
8 inspection-after cleaning station
9 wafer transfer region
10 cassette loading table
20 first transfer unit
30 peeling device
31 first cleaning device
32 second transfer unit
33 second cleaning device
40 bonding surface cleaning unit
41 non-bonding surface cleaning unit
42 substrate inverting unit
50 transfer path
51 transfer mechanism
100 housing
110 upper chuck
111 lower chuck
124 heating mechanism
141 heating mechanism
150 moving mechanism
190 porous chuck
230 Bernoulli chuck
250 housing
251 inlet/outlet
260 exhaust port
262 exhaust pipe
270 first holding unit
271 second holding unit
272 moving mechanism
300 control unit
310 post-treatment station
G adhesive
S support wafer
T overlapped wafer
W wafer to be processed

What is claimed is:

1. A substrate inverting device for inverting front and rear surfaces of a substrate, comprising:
 a first holding unit having a first Bernoulli chuck configured to hold a first surface of the substrate;
 a second holding unit disposed to face the first holding unit, and having a second Bernoulli chuck configured to hold a second surface of the substrate;
 a moving mechanism configured to relatively move at least one of the first holding unit and the second holding unit to approach each other and stay spaced apart from each other; and
 a transfer mechanism having a third Bernoulli chuck configured to hold the second surface of the substrate when transferring the substrate to the first holding unit, and configured to hold the first surface of the substrate when transferring the substrate from the second holding unit.

2. The substrate inverting device of claim 1, wherein the first holding unit, the second holding unit and the transfer mechanism hold the entire region of the first surface or the second surface of the substrate.

3. The substrate inverting device of claim 1, further comprising a rotation mechanism configured to rotate the transfer mechanism around a horizontal axis.

* * * * *